(12) United States Patent
Yokoyama et al.

(10) Patent No.: US 11,087,914 B2
(45) Date of Patent: Aug. 10, 2021

(54) COMMON MODE CHOKE COIL

(71) Applicant: TAIYO YUDEN CO., LTD., Tokyo (JP)

(72) Inventors: Daizo Yokoyama, Tokyo (JP); Koji Taketomi, Tokyo (JP); Kenichiro Nogi, Tokyo (JP); Hidemi Iwao, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 488 days.

(21) Appl. No.: 15/894,536

(22) Filed: Feb. 12, 2018

(65) Prior Publication Data

US 2018/0286558 A1 Oct. 4, 2018

(30) Foreign Application Priority Data

Mar. 31, 2017 (JP) .............................. JP2017-070319

(51) Int. Cl.
 *H01F 5/00* (2006.01)
 *H01F 27/24* (2006.01)
 (Continued)

(52) U.S. Cl.
 CPC ......... *H01F 27/24* (2013.01); *H01F 27/2804* (2013.01); *H03H 1/00* (2013.01);
 (Continued)

(58) Field of Classification Search
 USPC ....................................... 336/200, 232, 192
 See application file for complete search history.

(56) References Cited

U.S. PATENT DOCUMENTS

| | | | | |
|---|---|---|---|---|
| 2005/0012586 A1* | 1/2005 | Sutardja | .............. | H01F 27/2847 336/200 |
| 2005/0195062 A1* | 9/2005 | Yoshida | .............. | H01F 27/2804 336/200 |
| 2010/0301966 A1 | 12/2010 | Yoshino et al. | | |

FOREIGN PATENT DOCUMENTS

| | | |
|---|---|---|
| JP | 2007-242800 A | 9/2007 |
| JP | 2010-080594 A | 4/2010 |

(Continued)

OTHER PUBLICATIONS

Notice of Reasons for Refusal dated Mar. 2, 2021 issued in corresponding Japanese Patent Application No. 2017-070319 with full English machine translation (9 pgs.).

*Primary Examiner* — Shawki S Ismail
*Assistant Examiner* — Kazi S Hossain
(74) *Attorney, Agent, or Firm* — Pillsbury Winthrop Shaw Pittman, LLP (57) ABSTRACT

In a common mode choke coil having a magnetic core, a decrease in peak value of a common mode impedance in a vicinity of its resonance frequency is suppressed. A common mode choke coil includes a non-magnetic layer, a first magnetic layer formed on a top surface of the non-magnetic layer, a second magnetic layer formed on a bottom surface of the non-magnetic layer, a magnetic core provided between the first magnetic layer and the second magnetic layer so that its axis extends in a top-bottom direction, a first coil conductor embedded in the non-magnetic layer and wound around the magnetic core, a second coil conductor embedded in the non-magnetic layer and wound around the magnetic core, and a first magnetic gap provided between a top surface of the magnetic core and a bottom surface of the first magnetic layer. The magnetic core is made of a ferrite material.

16 Claims, 7 Drawing Sheets

(51) Int. Cl.
*H01F 27/28* (2006.01)
*H03H 1/00* (2006.01)
H01F 27/32 (2006.01)
H01F 27/29 (2006.01)

(52) U.S. Cl.
CPC ............ *H01F 27/29* (2013.01); *H01F 27/323* (2013.01); *H01F 2027/2809* (2013.01); *H03H 2001/0057* (2013.01); *H03H 2001/0078* (2013.01); *H03H 2001/0085* (2013.01)

(56) References Cited

FOREIGN PATENT DOCUMENTS

| | | | |
|---|---|---|---|
| JP | 2010-278301 A | | 12/2010 |
| JP | 2012119374 | * | 3/2012 |
| JP | 2012-119374 A | | 6/2012 |
| JP | 2016-213333 A | | 12/2016 |

* cited by examiner

COMMON MODE CHOKE COIL

CROSS-REFERENCE TO RELATED APPLICATIONS

This application is based on and claims the benefit of priority from Japanese Patent Application Serial No. 2017-070319 (filed on Mar. 31, 2017), the contents of which are hereby incorporated by reference in their entirety.

TECHNICAL FIELD

The present disclosure relates to a common mode choke coil.

BACKGROUND

In order to eliminate common mode noise from a differential transmission circuit which transmits a differential signal, a common mode choke coil is used. A common mode choke coil includes a plurality of coil conductors, and these coils conductors each function as an inductor that generates a common mode impedance with respect to common mode noise. Thus, common mode noise can be eliminated from the differential transmission circuit.

In order to increase an attenuation of common mode noise, it is desirable that the common mode choke coil have a large common mode impedance. There is known a common mode choke coil having a magnetic core made of a ferrite material so that a large common mode impedance is obtained. The common mode choke coil of this type is provided with a pair of magnetic layers provided on a top surface and a bottom surface of an insulator layer, respectively, a magnetic core that is made of a ferrite material and connects said pair of magnetic layers to each other, and a plurality of coil conductors embedded in said insulator layer so as to be wound around the magnetic core. Such a conventional common mode choke coil having a magnetic core made of a ferrite material is disclosed in, for example, Japanese Patent Application Publication No. 2012-119374 (the '374 Publication).

In a conventional common mode choke coil having a magnetic core made of a ferrite material, however, magnetic loss occurs in the magnetic core made of a ferrite material, so that a quality factor in a high-frequency band becomes lower than that of a common mode choke coil having no such a magnetic core. This results in a decrease in peak value of a common mode impedance appearing in a vicinity of a resonance frequency at a high frequency. As described above, the common mode choke coil having a magnetic core made of a ferrite material presents a problem that, due to an influence of the magnetic core made of a ferrite material, an attenuation of common mode noise is rather decreased in a vicinity of a resonance frequency.

SUMMARY

One object of the present invention is to suppress a decrease in peak value of a common mode impedance in a common mode choke coil having a magnetic core. Other objects of the present invention will be made apparent through description of the specification as a whole.

A common mode choke coil according to one embodiment of the present invention is provided with a non-magnetic layer, a first magnetic layer formed on a top surface of the non-magnetic layer, a second magnetic layer formed on a bottom surface of the non-magnetic layer, a magnetic core provided between the first magnetic layer and the second magnetic layer so that an axis thereof extends in a top-bottom direction, a first coil conductor embedded in the non-magnetic layer and wound around the magnetic core, a second coil conductor embedded in the non-magnetic layer and wound around the magnetic core, and a first magnetic gap provided between a top surface of the magnetic core and a bottom surface of the first magnetic layer. In one embodiment of the present invention, the magnetic core is made of a ferrite material.

According to said embodiment, the magnetic gap is provided between the magnetic core and the first magnetic layer, and thus there is suppressed an influence of magnetic loss in the magnetic core in a high-frequency band that occurs in a magnetic material. As a result, it is also possible to suppress deterioration in quality factor attributable to magnetic loss, so that a decrease in peak value of a common mode impedance is suppressed, and a resonance frequency of an impedance characteristic is increased.

In one embodiment of the present invention, the magnetic core is configured so that the top surface thereof has an area equal to or larger than a cross-sectional area of the magnetic core in a direction perpendicular to the axis.

According to said embodiment, the top surface of the magnetic core, which faces the first magnetic gap, has an area equal to or larger than a cross-sectional area of a portion of the magnetic core other than the top surface, and thus it is possible to suppress an amount of leakage of magnetic flux in said first gap portion, the magnetic flux passing through said magnetic core in an axial direction. Thus, it becomes unlikely that magnetic flux leakage interferes with the first coil conductor and the second coil conductor. Accordingly, it is possible to suppress magnetic loss in the magnetic core in a high-frequency band and to suppress deterioration in frequency characteristic.

In one embodiment of the present invention, the magnetic core has a first portion and a second portion separated from each other in a direction along the axis. A common mode choke coil according to one embodiment of the present invention is provided further with a second magnetic gap provided between the first portion and the second portion and made of a non-magnetic material. The second magnetic gap is formed so as to have a thickness in the top-bottom direction smaller than a thickness of the first magnetic gap in the top-bottom direction.

According to said embodiment, the second magnetic gap is formed so as to be thinner than the first magnetic gap in the top-bottom direction, and thus it becomes unlikely that magnetic flux leakage interferes with the first coil conductor and the second coil conductor. Thus, magnetic flux leakage from the second magnetic gap can be decreased. Accordingly, it is possible to suppress magnetic loss in the magnetic core in a high-frequency band and to suppress deterioration in frequency characteristic.

In one embodiment of the present invention, the first coil conductor is disposed more closely to the first magnetic layer than the second coil conductor, and the first magnetic gap has a thickness in the top-bottom direction smaller than a distance between a top surface of the first coil conductor and the first magnetic layer.

According to said embodiment, it becomes unlikely that leakage magnetic flux from the first magnetic gap interferes with the first coil conductor and the second coil conductor. With this configuration, a distance between the first and second coil conductors and the magnetic core can be decreased. Consequently, according to said embodiment, it becomes possible to obtain a common mode choke coil further reduced in size.

In one embodiment of the present invention, a ratio of a thickness of the first magnetic gap in the top-bottom direction to a distance between the bottom surface of the first magnetic layer and a top surface of the second magnetic layer is smaller than 0.1.

In the embodiment having the second magnetic gap, a ratio of a sum of a thickness of the first magnetic gap in the top-bottom direction and a thickness of the second magnetic gap in the top-bottom direction to a distance between the bottom surface of the first magnetic layer and a top surface of the second magnetic layer is smaller than 0.1.

According to these embodiments, locations where magnetic flux leakage occurs are dispersed, and a range of magnetic flux leakage at each of the locations can be decreased, so that it becomes unlikely that magnetic flux leakage interferes with the first coil conductor and the second coil conductor. Accordingly, it is possible to further suppress an influence of magnetic flux leakage on a resonance frequency.

Advantages

According to the disclosure of this specification, in a common mode choke coil having a magnetic core, it is possible to suppress a decrease in peak value of a common mode impedance thereof, and this also leads to an increase in resonance frequency of an impedance characteristic.

DESCRIPTION OF THE PREFERRED EMBODIMENTS

By appropriately referring to the appended drawings, the following describes various embodiments of the present invention. Constituent components common to a plurality of drawings are denoted by the same reference signs throughout said plurality of drawings. It is to be noted that, for the sake of convenience of description, the drawings are not necessarily depicted to scale.

Figure 1:
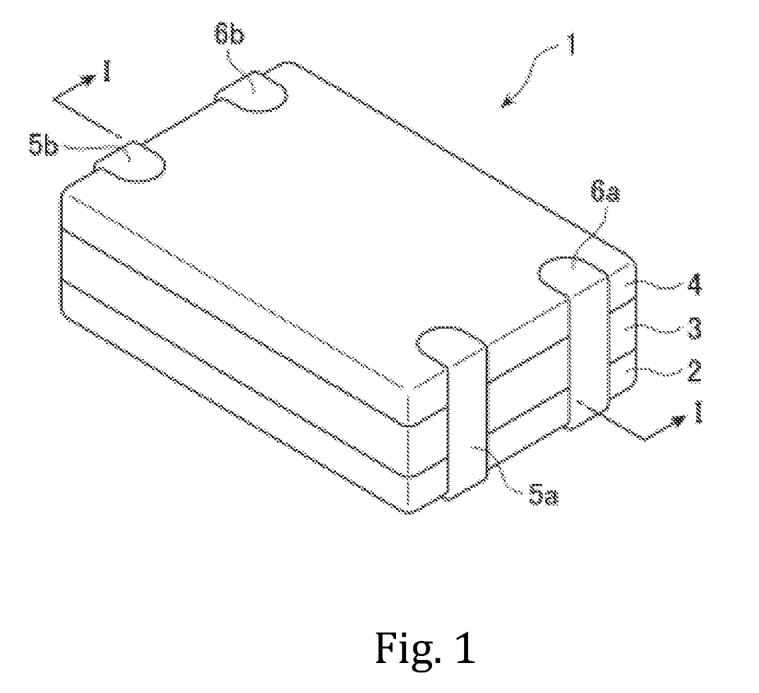
FIG. 1 is a perspective view of a common mode choke coil according to one embodiment of the present invention.

FIG. 1 is a perspective view of a common mode choke coil according to one embodiment of the present invention. A common mode choke coil 1 shown in FIG. 1 includes a bottom magnetic layer 2, a non-magnetic layer 3, a top magnetic layer 4, and terminal electrodes 5a, 5b, 6a, and 6b. As shown in the figure, the bottom magnetic layer 2 is formed on a bottom surface of the non-magnetic layer 3, and the top magnetic layer 4 is formed on a top surface of the non-magnetic layer 3. As show in the figure, the common mode coke coil 1 is in a substantially rectangular parallelepiped shape. The common mode choke coil 1 has dimensions of, for example, 1.25 mm×1.0 mm×0.5 mm. In this specification, in a case where the top-bottom direction of the common mode choke coil 1 is referred to, unless contextually interpreted otherwise, "up" refers to an upward direction in FIG. 1 and "down" refers to a downward direction in FIG. 1.

The terminal electrodes 5a, 5b, 6a, and 6b are provided on side surfaces of the non-magnetic layer 3 and extend, as shown in the figure, to a top surface and a bottom surface of the common mode choke coil 1. The terminal electrodes 5a, 5b, 6a, and 6b are formed of, for example, an Ag paste.

Figure 2:
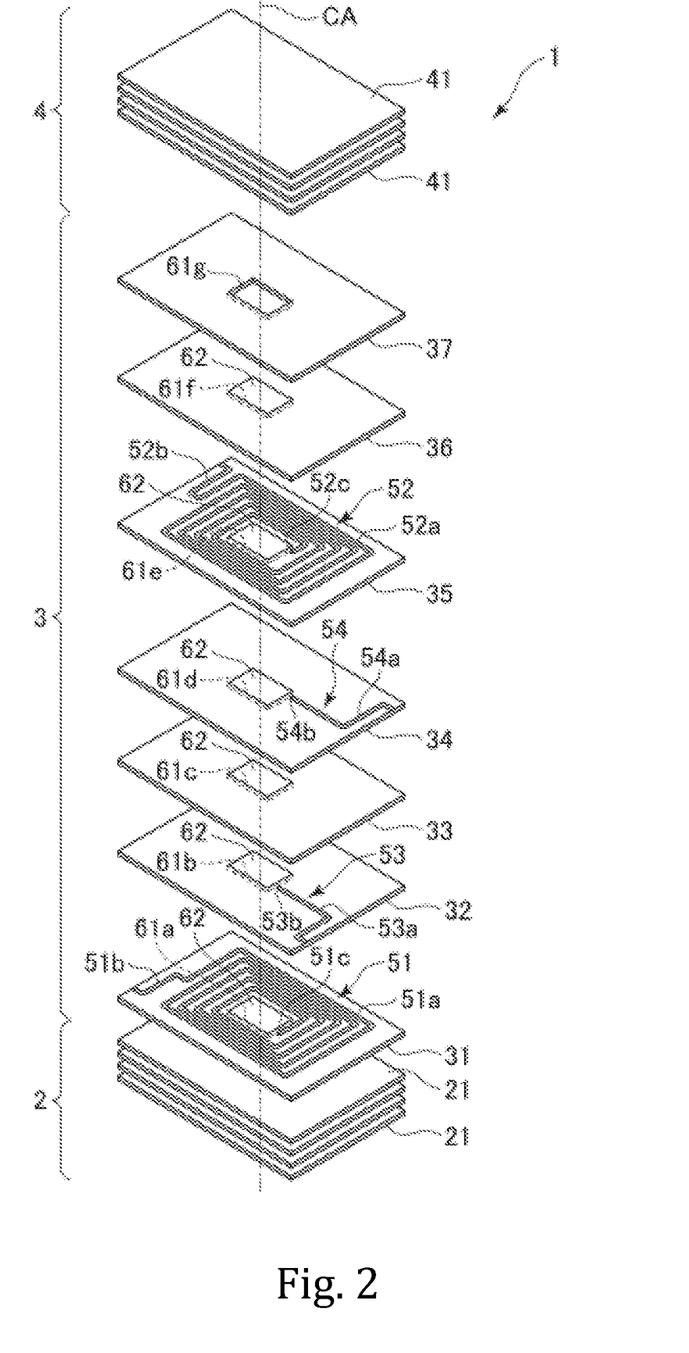
FIG. 2 is an exploded perspective view of the common mode choke coil shown in FIG. 1.
Figure 3:
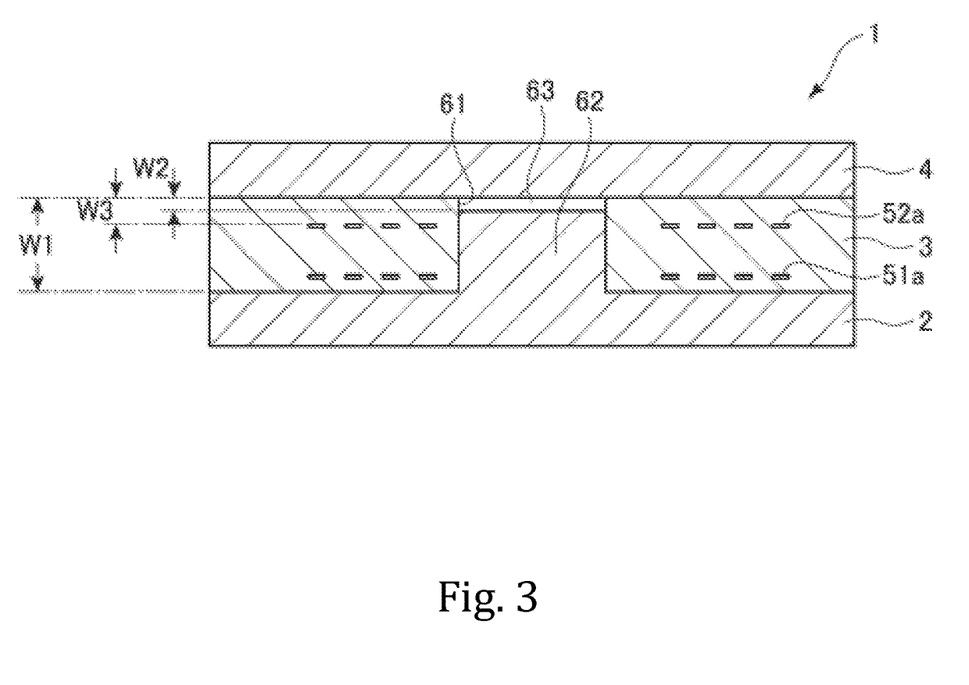
FIG. 3 is a sectional view schematically showing a cross section obtained by cutting the common mode choke coil shown n FIG. 1 along a line I-I.

Next, with reference to FIG. 2 and FIG. 3, a further description is given of the common mode choke coil 1. As shown in an exploded perspective view of FIG. 2, the bottom magnetic layer 2 according to one embodiment of the present invention is a laminate of a plurality of magnetic sheets 21. Each of the magnetic sheets 21 is made of slurry containing a magnetic powder, a binder resin, and a solvent. Specifically, the slurry applied in a uniform thickness is dried, and the slurry thus dried is cut into a predetermined size, so that each of the magnetic sheets 21 is obtained.

The top magnetic layer 4 according to one embodiment of the present invention is a laminate of a plurality of magnetic sheets 41. Similarly to the magnetic sheets 21, each of the magnetic sheets 41 is made of slurry containing a magnetic powder, a binder resin, and a solvent.

As the magnetic powder contained in each of the magnetic sheets 21 and the magnetic sheets 41, for example, a powder of Ni—Cu—Zn-based ferrite, Ni—Cu—Zn—Mg-based ferrite, Cu—Zn-based ferrite, Ni—Cu-based ferrite, or any other known type of ferrite can be used. Such a ferrite powder is made mainly of, for example, $FeO_2$, CuO, ZnO, and NiO. The magnetic sheets 21 and the magnetic sheets 41 may contain metal magnetic particles in place of or together with the above-described magnetic powder. The metal magnetic particles may be made of, for example, a soft magnetic material including several elements among Fe, Si, Al, Cr, and Ni. The metal magnetic particles may be formed in a spherical shape or a flat shape. Flat-shaped metal magnetic particles may be arranged so that a longest axis direction thereof is oriented in a thickness direction of the magnetic sheets 21 and the magnetic sheets 41 (a direction parallel to a coil axis CA). By arranging the flat-shaped metal magnetic particles so that the longest axis direction thereof is oriented in the direction parallel to the coil axis CA, it is possible to increase an effective magnetic permeability of a common mode choke coil 1 and to reduce magnetic loss.

In one embodiment of the present invention, the non-magnetic layer 3 is a laminate of seven non-magnetic sheets (non-magnetic sheets 31 to 37). Each of the non-magnetic sheets 31 to 37 is made of any one of various types of non-magnetic materials. As such a non-magnetic material, for example, various types of resin materials (for example, a polyimide resin, an epoxy resin, and any other type of resin material), various types of dielectric ceramic (borosilicate glass, a mixture of borosilicate glass and crystalline silica, and any other type of dielectric ceramic), or various types of non-magnetic ferrite (for example, Zn—Cu-based ferrite) can be used.

A conductor layer 51 is formed on a surface of the non-magnetic sheet 31. The conductor layer 51 includes a coil conductor 51a and an extraction conductor 51b extending from an outer end portion of the coil conductor 51a to the terminal electrode 5b. The extraction conductor 51b is electrically connected to the terminal electrode 5b. The coil conductor 51a is electrically connected, at an inner end portion 51c thereof, to an after-mentioned conductor layer 53 formed on a surface of the non-magnetic sheet 32. The coil conductor 51a is wound a plurality of turns around the coil axis CA, thus having a spiral shape. The coil axis CA is a virtual axis extending in a stacking direction of the non-magnetic layer 3 (namely, the top-bottom direction of the common mode choke coil 1). The coil axis CA extends in a direction substantially orthogonal to the non-magnetic layer 3.

A conductor layer 52 is formed on a surface of the non-magnetic sheet 35. The conductor layer 52 includes a coil conductor 52a and an extraction conductor 52b extending from an outer end portion of the coil conductor 52a to the terminal electrode 6b. The extraction conductor 52b is electrically connected to the terminal electrode 6b. The coil conductor 52a is electrically connected, at an inner end portion 52c thereof, to an after-mentioned conductor layer 54 formed on a surface of the non-magnetic sheet 34. The coil conductor 52a is wound a plurality of turns around the coil axis CA, thus having a spiral shape.

The conductor layer 53 is formed on the surface of the non-magnetic sheet 32. The conductor layer 53 has an extraction conductor 53a. The extraction conductor 53a is electrically connected, at an outer end portion thereof, to the terminal electrode 5a. On the non-magnetic sheet 32, at a position corresponding to the inner end portion 51c of the coil conductor 51a in planar view, there is provided a through-hole conductor (not shown) penetrating the non-magnetic sheet 32 in a thickness direction thereof. The extraction conductor 53a extends inwardly to a position corresponding to said through-hole conductor. Therefore, the extraction conductor 53a is formed so that an inner end portion 53b thereof is at the position corresponding to the through-hole conductor of the non-magnetic sheet 32. The extraction conductor 53a is electrically connected to the coil conductor 51a via said through-hole conductor.

The conductor layer 54 is formed on the surface of the non-magnetic sheet 34. The conductor layer 54 has an extraction conductor 54a. The extraction conductor 54a is electrically connected, at an outer end portion thereof, to the terminal electrode 6a. On the non-magnetic sheet 35, at a position corresponding to the inner end portion 52c of the coil conductor 52a in planar view, there is provided a through-hole conductor (not shown) penetrating the non-magnetic sheet 35 in a thickness direction thereof. The extraction conductor 54a extends inwardly to a position corresponding to said through-hole conductor. Therefore, the extraction conductor 54a is formed so that an inner end portion 54b thereof is at the position corresponding to the through-hole conductor of the non-magnetic sheet 35. The extraction conductor 54a is electrically connected to the coil conductor 52a via said through-hole conductor.

The conductor layer 51, the conductor layer 52, the conductor layer 53, and the conductor layer 54 are each made of a metal material such as Ag. It is desirable that the metal material be excellent in electrical conductivity and workability. As the metal material, besides Ag, Cu or Al can be used.

Penetration holes 61a to 61g penetrating an inner side of the coil conductors 51a and 52a are formed in the non-magnetic sheets 31 to 37, respectively. In one embodiment of the present invention, the through-holes 61a to 61g are each formed in a corresponding one of the non-magnetic sheets 31 to 37 as to be equal in shape to each other. Furthermore, the penetration holes 61a to 61g are each formed in a corresponding one of the non-magnetic sheets 31 to 37 at a position where they overlie each other in planar view. With this configuration, when the non-magnetic sheets 31 to 37 are stacked on each other, the penetration holes 61a to 61g are joined to each other to form a single penetration hole 61. In another embodiment of the present invention, among penetration holes 61a to 61g, some are formed to have a cross-sectional area (an area of a cross section cut along a direction perpendicular to the coil axis CA) larger than that of others. The penetration holes 61a to 61g are each formed so that a cross section thereof cut along the direction perpendicular to the coil axis CA has a circular shape, an ellipsoidal shape, a rectangular shape, a polygonal shape, or any other shape. The penetration hole 61 formed in the above-described manner penetrates the non-magnetic layer 3 in a direction of the coil axis CA.

The penetration hole 61 has a magnetic core 62 provided therein. The magnetic core 62 is formed to have a cross-sectional shape corresponding to a cross-sectional shape of the penetration hole 61. In one embodiment of the present invention, the magnetic core 62 is formed by filling the penetration hole 61 with a resin paste containing a magnetic powder, a binder resin, and a solvent and drying the resin paste, followed by firing. As the magnetic powder, a ferrite material (for example, Ni—Cu—Zn-based ferrite, Ni—Cu—Zn—Mg-based ferrite, Cu—Zn-based ferrite, or Ni—Cu-based ferrite) can be used. The magnetic core 62 may contain metal magnetic particles in place of or together with the above-described magnetic powder. The metal magnetic particles may be made of, for example, a soft magnetic material including several elements among Fe, Si, Al, Cr, and Ni. The metal magnetic particles may be formed in a spherical shape or a flat shape. Flat-shaped metal magnetic particles may be arranged so that a longest axis direction thereof is oriented in the thickness direction of the magnetic sheets 21 and the magnetic sheets 41 (the direction parallel to the coil axis CA). By arranging the flat-shaped metal magnetic particles so that the longest axis direction thereof is oriented in the direction parallel to the coil axis CA, it becomes possible to increase an effective magnetic permeability of the common mode choke coil 1 and to reduce loss caused in the metal magnetic particles to a low level, and thus magnetic loss can be reduced.

In one embodiment of the present invention, the magnetic core 62 is provided so that a bottom end thereof comes in contact with the bottom magnetic layer 2, while a top end thereof does not come in contact with the top magnetic layer 4. In the embodiment shown in FIG. 2, the magnetic core 62 is formed so that a top surface thereof is substantially flush with a top surface of the non-magnetic sheet 36. In this case, the top surface of the magnetic core 62 and a bottom surface of the top magnetic layer 4 are separated from each other by a distance corresponding to a thickness of the non-magnetic sheet 37. In this manner, a magnetic gap 63 (see FIG. 3) is provided between the magnetic core 62 and the top magnetic layer 4. In one embodiment of the present invention, the magnetic gap 63 is an air gap. In another embodiment of the present invention, the magnetic gap 63 is formed of a low magnetic permeability magnetic material. In this specification, the low magnetic permeability magnetic material refers to a material having a magnetic permeability that is one-tenth or less of a magnetic permeability of the magnetic sheets 21 and the magnetic sheets 41. By using a non-magnetic material or a low magnetic permeability magnetic body to form the magnetic gap 63, the magnetic gap 63 can be formed to have a thickness (a dimension in the direction parallel to the coil axis CA) larger than that of an air gap. The magnetic gap 63 is formed by, for example, filling a gap (an air gap) between the magnetic core 62 and the top magnetic layer 4 with the non-magnetic material or the low magnetic permeability magnetic material. The magnetic gap 63 may be formed by printing, in the gap between the magnetic core 62 and the top magnetic layer 4, a resin paste containing a binder resin made of the non-magnetic material or the low magnetic permeability magnetic material as well as a solvent. The magnetic gap 63 is formed by placing a sheet made of the non-magnetic material or the low magnetic permeability magnetic material in the gap between the magnetic core 62 and the top magnetic layer 4. Furthermore, it is also possible to use a non-magnetic sheet as in the non-magnetic layer 3, in which case adhesion to a non-magnetic body is easily secured, and peeling can be prevented even with a reduced thickness of the sheet.

With reference to FIG. 3, a further description is given of dimensions and an arrangement of the magnetic gap 63. In one embodiment of the present invention, the magnetic gap 63 is formed so that a ratio of a width (W2) of the magnetic gap 63 in the top-bottom direction to a width (W1) between the bottom surface of the top magnetic layer 4 and a top surface of the bottom magnetic layer 2 has a value (W2/W1) smaller than 0.1. In the embodiment shown in FIG. 3, the width (W1) between the bottom surface of the top magnetic layer 4 and the top surface of the bottom magnetic layer 2 is equal to a width of the non-magnetic layer 3 in the top-bottom direction. In a case where a diffusion layer is provided at a boundary between the non-magnetic layer 3 and the top magnetic layer 4 and at a boundary between the non-magnetic layer 3 and the bottom magnetic layer 2, the width (W1) between the bottom surface of the top magnetic layer 4 and the top surface of the bottom magnetic layer 2 is equal to a sum of the width of the non-magnetic layer 3 in the top-bottom direction and widths of the diffusion layers in the top-bottom direction. Each of the coil conductor 51a and the coil conductor 52a may be formed in two or more tiers. The width W2 of the magnetic gap 63 in the top-bottom direction is equal to a distance between the top surface of the magnetic core 62 and the bottom surface of the top magnetic layer 4.

By forming the magnetic gap 63 so that W2/W1 has a value smaller than 0.1, magnetic flux leakage can be decreased, and thus interference between magnetic flux and the coil conductors 51a and 52a is reduced. Thus, it is possible to further suppress an influence of magnetic flux leakage on a resonance frequency.

In one embodiment of the present invention, the magnetic gap 63 is formed so that the width W2 of the magnetic gap 63 in the top-bottom direction is smaller than a distance W3 between a top surface of the conductor layer 52 (a top surface of the coil conductor 52a) and the bottom surface of the top magnetic layer 4. By arranging the magnetic gap 63 in this manner, it is possible to make it unlikely that leakage magnetic flux from the magnetic gap 63 interferes with the coil conductor 52a. With this configuration, a distance between the coil conductor 52a and the magnetic core 62 can be decreased. Consequently, it becomes possible to achieve a size reduction of the common mode choke coil 1.

The above-mentioned materials of the bottom magnetic layer 2, the non-magnetic layer 3, the top magnetic layer 4, the terminal electrodes 5a, 5b, 6a, and 6b, and the magnetic core 62 are illustrative only, and depending on required performance and required characteristics of the common mode choke coil 1, besides the materials explicitly described in this specification, various other materials can also be used.

By the above-mentioned configuration and arrangement, in the common mode choke coil 1, two coils are provided between the terminal electrodes 5a and 5b and the terminal electrodes 6a and 6b, respectively. That is, an outer end of the coil conductor 51a is electrically connected to the terminal electrode 5b via the extraction conductor 51b, and the inner end 51c of the coil conductor 51a is electrically connected to the terminal electrode 5a via the through hole formed in the non-magnetic sheet 32 and the extraction conductor 53a, so that a first coil including the coil conductor 51a is configured between the terminal electrode 5a and the terminal electrode 5b. Similarly, an outer end of the coil conductor 52a is electrically connected to the terminal electrode 6b via the extraction conductor 52b, and the inner end 52c of the coil conductor 52a is electrically connected to the terminal electrode 6a via the through hole formed in the non-magnetic sheet 35 and the extraction conductor 54a, so that a second coil including the coil conductor 52a is configured between the terminal electrode 6a and the terminal electrode 6b. Both of the first coil and the second coil have the magnetic core 62.

Next, a description is given of one example of a method for manufacturing the common mode choke coil 1. First, a magnetic green sheet used to form each of the magnetic sheets 21 and the magnetic sheets 41 and a non-magnetic green sheet used to form each of the non-magnetic sheets 31 to 37 are fabricated in the following manner.

In order to fabricate the magnetic green sheet, slurry is made by adding a butyral resin and a solvent to a calcined and ground Ni—Zn—Cu-based ferrite fine powder made mainly of $FeO_2$, CuO, ZnO, and NiO. The slurry is applied on a substrate in a uniform thickness by using a doctor blade, and the slurry thus applied is dried. The slurry after being dried is cut into a predetermined size, and thus the magnetic green sheet is obtained.

In order to fabricate the non-magnetic green sheet, slurry is made by adding a butyral resin and a solvent to a calcined and ground Zn—Cu-based ferrite fine powder made mainly of $FeO_2$, CuO, and ZnO. The slurry is applied on a substrate in a uniform thickness by using a doctor blade, and the slurry thus applied is dried. The slurry after being dried is cut into a predetermined size, and thus the non-magnetic green sheet is obtained.

In each of the non-magnetic green sheets thus fabricated, a penetration hole is formed at a position corresponding to the penetration hole 61. Furthermore, in each of the non-magnetic green sheets, a penetration hole is formed also at a position corresponding to the through-hole conductor for inter-layer connection. These penetration holes are formed by, for example, punching holes in the magnetic green sheets or by perforating the magnetic green sheets with holes by laser irradiation.

On one of the plurality of non-magnetic green sheets thus fabricated, which corresponds to the non-magnetic sheet 31, a conductor pattern corresponding to the conductor layer 51 is formed by printing an Ag paste by using, for example, a screen printing plate. Similarly, on one of the plurality of non-magnetic green sheets, which corresponds to the non-magnetic sheet 32, a conductor pattern corresponding to the conductor layer 53 is formed. Further, on another one of the plurality of non-magnetic green sheets, which corresponds to the non-magnetic sheet 34, a conductor pattern corresponding to the conductor layer 54 is formed, and on still another one of the plurality of non-magnetic green sheets, which corresponds to the non-magnetic sheet 35, a conductor pattern corresponding to the conductor layer 52 is formed. Furthermore, Ag is embedded in the penetration holes for through holes formed in each of the non-magnetic green sheets.

The conductor layers 51 to 54 can be formed also by various known methods in addition to screen printing. For example, vapor deposition using a mask, a thin film process such as sputtering, plating of a seed layer formed by the thin film process or the like, a microtransfer process such as nano-imprinting, and so on can be used to form these conductive layers. In a conductor fabricated by printing or the microtransfer process, a height of said conductor with respect to a width thereof (an aspect ratio) can hardly be increased and thus is normally lower than 1, while in a conductor fabricated by the thin film process or plating, the aspect ratio can be increased even to, for example, 1 or higher. Consequently, by using the printing or microtransfer process to form conductor patterns for the conductor layers 51 to 54, designing of a stray capacitance is facilitated.

Next, the non-magnetic green sheets fabricated in the above-mentioned manner, which correspond to the non-magnetic sheets 31 to 37, respectively, are stacked on each other in an order shown in FIG. 2 so that the conductor patterns printed thereon are brought into conduction via the through hole conductors. The plurality of non-magnetic green sheets thus stacked on each other are press-bonded to form a laminate of a non-magnetic body (hereinafter, referred to as a "non-magnetic laminate") corresponding to the non-magnetic layer 3. In the non-magnetic laminate, the penetration hole 61 is present that results from joining the penetration holes 61a to 61g to each other.

Next, the penetration hole 61 formed in the above-described non-magnetic laminate is filled with a resin paste containing a magnetic powder, a binder resin, and a solvent. The resin paste is filled only in part of the penetration hole 61 so that the magnetic gap 63 is formed in the common mode choke coil 1 as completed. In one embodiment of the present invention, said resin paste is filled in portions of the penetration hole 61, which correspond to the penetration holes 61a to 61f, respectively, and not filled in a portion of the penetration hole 61, which corresponds to the penetration hole 61g. With this configuration, in the common mode choke coil 1 as completed, the magnetic gap 63 is formed in the portion corresponding to the penetration hole 61g.

Next, the non-magnetic laminate in which the penetration hole 61 is filled with the resin paste is dried so that the solvent contained in said resin paste is eliminated.

Next, a predetermined number of magnetic green sheets as mentioned above are stacked on each other to form each of a magnetic laminate corresponding to the bottom magnetic layer 2 and a magnetic laminate corresponding to the top magnetic layer 4.

Next, the magnetic laminate corresponding to the bottom magnetic layer 2 is press-bonded to a bottom surface of the non-magnetic laminate, and the magnetic laminate corresponding to the top magnetic layer 4 is press-bonded to a top surface of said non-magnetic laminate. The magnetic laminate corresponding to the top magnetic layer 4 is press-bonded so that an interstice corresponding to the magnetic gap 63 is provided between itself and said non-magnetic laminate.

A laminate resulting from the press-bonding is cut into units of a predetermined size, and each of the units thus obtained by cutting the laminate is fired at a predetermined temperature to form a laminated chip. Next, an Ag paste is applied and baked on side surfaces of the laminated chip thus formed, so that the terminal electrodes 5a, 5b, 6a, and 6b are formed thereon.

The common mode coke coil 1 is formed in this manner. The above-mentioned method for manufacturing the common mode choke coil 1 is merely one example, and a method for fabricating a common mode choke coil to which the present invention is applicable is not limited thereto. For example, instead of forming the conductor layers 51 to 54 on the non-magnetic green sheets by the screen printing, it may also be possible that, after the non-magnetic green sheets are fired, the conductor layers 51 to 54 are formed thereon by, for example, photolithography. Furthermore, instead of individually forming the penetration holes 61a to 61g in the plurality of non-magnetic green sheets, it may also be possible that the plurality of non-magnetic green sheets are stacked to each other to form a non-magnetic laminate, and then the penetration hole 61 is formed in said non-magnetic laminate by one operation.

Figure 4:
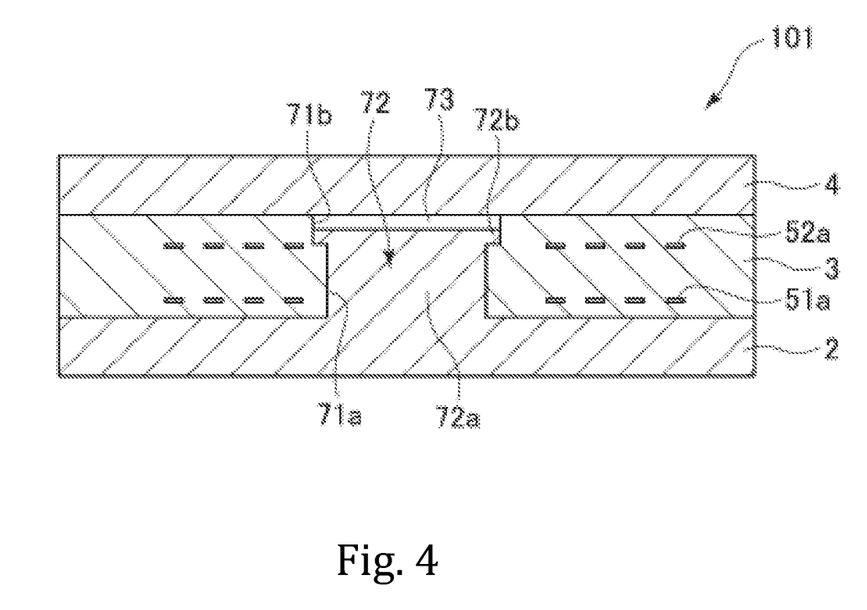
FIG. 4 is a sectional view schematically showing a cross section of a common mode choke coil according to another embodiment of the present invention.

Subsequently, with reference to FIG. 4, a description is given of a common mode filter according to another embodiment of the present invention. FIG. 4 is a sectional view schematically showing a cross section of a common mode choke coil 101 according to another embodiment of the present invention. In the common mode choke coil 101 shown in FIG. 4, constituent components that are the same as or similar to those of the common mode choke coil 1 shown in FIGS. 1 to 3 are denoted by reference characters similar to those in FIGS. 1 to 3, and detailed descriptions thereof are omitted.

As shown in FIG. 4, in the common mode choke coil 101, in place of the penetration hole 61, a penetration hole 71a and a penetration hole 71b are formed in a non-magnetic layer 3. Specifically, in the non-magnetic layer 3 of the common mode choke coil 101, there are formed the first penetration hole 71a extending in a direction of a coil axis CA from a bottom surface of the non-magnetic layer 3 and the second penetration hole 71b joined to said first penetration hole 71a and extending in the direction of the coil axis CA to a top surface of the non-magnetic layer 3. As shown in the figure, the second penetration hole 71b is formed so as to have a cross-sectional area (an area of a cross section cut along a direction perpendicular to the coil axis CA) larger than that of the first penetration hole 71a For example, by forming the penetration hole 61f formed in the non-magnetic sheet 36 and the penetration hole 61g formed in the non-magnetic sheet 37 so that their cross-sectional area is larger than a cross-sectional area of the other penetration holes 61a to 61e, the second penetration hole 71b having a cross-sectional area larger than that of the first penetration hole 71a can be obtained.

The first penetration hole 71a and the second penetration hole 71b have a magnetic core 72 provided therein. The magnetic core 72 has a small diameter portion 72a provided in the first penetration hole 71a and a large diameter portion 72b provided in the second penetration hole 71b. The small diameter portion 72a is connected, at a top surface thereof, to the large diameter portion 72b. The magnetic core 72 is obtained by filling the first penetration hole 71a and the second penetration hole 71b formed in the above-described manner with a resin paste containing a magnetic powder, a binder resin, and a solvent and drying and firing said resin paste.

The magnetic core 72 is provided so that a bottom end thereof comes in contact with a bottom magnetic layer 2, while a top end thereof does not come in contact with a top magnetic layer 4. In one embodiment, the magnetic core 72 is provided by, for example, entirely filling the first penetration hole 71a and partly filling the second penetration hole 71b with the resin paste. For example, the magnetic core 72 is formed so that a top surface thereof is substantially flush with the top surface of the non-magnetic sheet 36. In this case, the top surface of the magnetic core 72 and a bottom surface of the top magnetic layer 4 are separated from each other by a distance corresponding to the thickness of the non-magnetic sheet 37. In this manner, a magnetic gap 73 is provided between the magnetic core 72 and the top magnetic layer 4.

According to the embodiment shown in FIG. 4, the large diameter portion 72b of the magnetic core 72, which faces the magnetic gap 73, has a cross-sectional area larger than a cross-sectional area of the small diameter portion 72a of the magnetic core 72, which is in contact with the bottom magnetic layer 2. With this configuration, leakage of magnetic flux from the magnetic gap 73 can be decreased, the magnetic flux passing through the magnetic core 72 in an axial direction. Thus, it becomes unlikely that magnetic flux leakage interferes with the first coil conductor 52a and the second coil conductor 51a. Accordingly, it is possible to further suppress an influence of magnetic flux leakage on a resonance frequency. Furthermore, the magnetic gap 73 is increased in size, and thus dimensional control of a member (such as a resin sheet) constituting the magnetic gap 73 is facilitated. Thus, an influence of the magnetic gap 73 exerted on a resonance frequency can be stabilized. Furthermore, since the magnetic gap 73 is increased in size, productivity can be improved.

Figure 5:
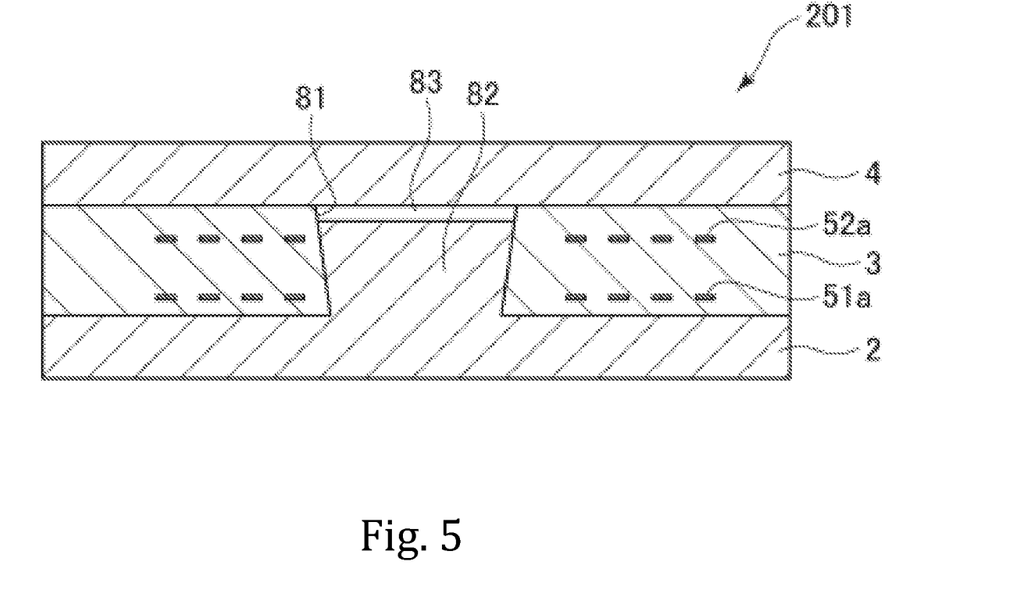
FIG. 5 is a sectional view schematically showing a cross section of a common mode choke coil according to still another embodiment of the present invention.

Subsequently, with reference to FIG. 5, a description is given of a common mode filter according to still another embodiment of the present invention. FIG. 5 is a sectional view schematically showing a cross section of a common mode choke coil 201 according to still another embodiment of the present invention. In the common mode choke coil 201 shown in FIG. 5, constituent components that are the same as or similar to those of the common mode choke coil 1 shown in FIGS. 1 to 3 are denoted by reference characters similar to those in FIGS. 1 to 3, and detailed descriptions thereof are omitted.

As shown in FIG. 5, in the common mode choke coil 201, in place of the penetration hole 61, a penetration hole 81 is formed in a non-magnetic layer 3. The penetration hole 81 penetrates the non-magnetic layer 3 in a direction along a coil axis CA and is formed so that a cross-sectional area thereof in a direction perpendicular to the coil axis CA increases upward.

The penetration hole 81 has a magnetic core 82 provided therein. The magnetic core 82 is obtained by filling the penetration hole 81 formed in the above-described manner with a resin paste containing a magnetic powder, a binder resin, and a solvent and drying or firing said resin paste.

The magnetic core 82 is provided so that a bottom end thereof comes in contact with a bottom magnetic layer 2, while a top end thereof does not come in contact with a top magnetic layer 4. Thus, a magnetic gap 83 is provided between the magnetic core 82 and the top magnetic layer 4.

According to the embodiment shown in FIG. 5, a top end surface of the magnetic core 82 has an area larger than a cross-sectional area of a portion of the magnetic core 82 other than the top end surface. That is, the magnetic core 82 is tapered so as to have a diameter increasing toward the top end surface thereof. In another embodiment of the present invention, the magnetic core 82 may be tapered so as to have a diameter increasing toward the top end surface thereof and increasing also toward a bottom end surface thereof. According to these embodiments, it becomes unlikely that leakage of magnetic flux from the magnetic gap 83 interferes with the first coil conductor and the second coil conductor, the magnetic flux passing through the magnetic core 82 in an axial direction. Thus, it is possible to further suppress an influence of magnetic flux leakage on a frequency characteristic.

Figure 6:
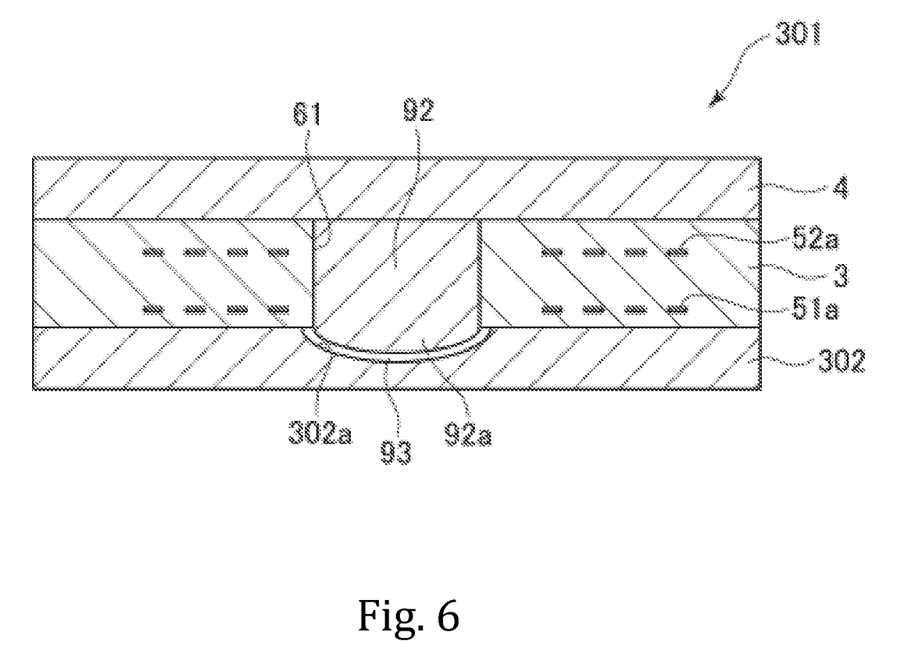
FIG. 6 is a sectional view schematically showing a cross section of a common mode choke coil according to yet another embodiment of the present invention.

Subsequently, with reference to FIG. 6, a description is given of a common mode filter according to yet another embodiment of the present invention. FIG. 6 is a sectional view schematically showing a cross section of a common mode choke coil 301 according to yet another embodiment of the present invention. In the common mode choke coil 301 shown in FIG. 6, constituent components that are the same as or similar to those of the common mode choke coil 1 shown in FIGS. 1 to 3 are denoted by reference characters similar to those in FIGS. 1 to 3, and detailed descriptions thereof are omitted.

As shown in FIG. 6, in the common mode choke coil 301, a bottom magnetic layer 302 is provided in place of the bottom magnetic layer 2. The bottom magnetic layer 302 has a concave portion 302a formed on a top surface thereof. The concave portion 302a is formed at a position on the top surface of the bottom magnetic layer 302, which corresponds to a penetration hole 61. As shown in the figure, the concave portion 302a is formed in the bottom magnetic layer 302 so as to have, for example, an arc-shaped cross section. The concave portion 302a is not limited in shape to a shape shown in the figure and can rather be formed in various shapes. The concave portion 302a may be formed so as to have, for example, a rectangular cross section.

The penetration hole 61 has a magnetic core 92 provided therein. The magnetic core 92 is obtained by filling the penetration hole 61 with a resin paste containing a magnetic powder, a binder resin, and a solvent and drying and firing said resin paste. The magnetic core 92 is formed so as to have a protruding portion 92a protruding downward from a bottom surface of a non-magnetic layer 3. The protruding portion 92a is formed so as to be opposed to the concave portion 302a of the bottom magnetic layer 302.

Similarly to the penetration hole 81, the penetration hole 61 may be formed so that a cross-sectional area thereof in a direction perpendicular to a coil axis CA decreases downward. With this configuration, a distance between the magnetic core 92 and a coil conductor 51a can be increased. Conversely thereto, the penetration hole 61 may be formed so that a cross-sectional area thereof in the direction perpendicular to the coil axis CA increases downward. With this configuration, a magnetic gap 93 can be formed in an increased size. By forming the magnetic gap 93 in an increased size, dimensional control of a member (such as a resin sheet) constituting the magnetic gap 93 is facilitated. Thus, an influence of the magnetic gap 93 exerted on a resonance frequency can be stabilized. Furthermore, since the magnetic gap 93 is increased in size, productivity can be improved.

The magnetic core 92 is provided so that a top end thereof comes in contact with a top magnetic layer 4, while the protruding portion 92a provided at a bottom end thereof does not come in contact with the bottom magnetic layer 302. Thus, the magnetic gap 93 is provided between the magnetic core 92 and the bottom magnetic layer 302.

According to the embodiment shown in FIG. 6, a bottom end surface of the magnetic core 92 has an area larger than a cross-sectional area of a portion of the magnetic core 92 other than the bottom end surface. Thus, it is possible to suppress leakage of magnetic flux from the magnetic gap 93, the magnetic flux passing through the magnetic core 92 in an axial direction. Furthermore, according to the embodiment shown in FIG. 6, a bottom end of the magnetic core 92 is fit into the concave portion 302a formed in the bottom magnetic layer 302, and thus it is possible to further suppress magnetic flux leakage from the magnetic gap 93. Thus, it is possible to suppress an influence of magnetic flux leakage on a frequency characteristic.

Figure 7:
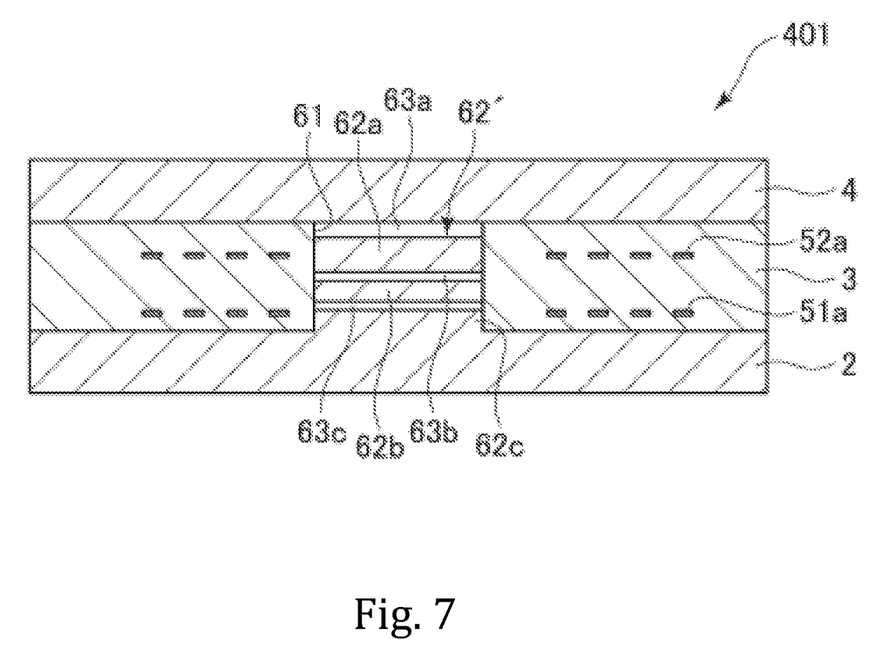
FIG. 7 is a sectional view schematically showing a cross section of a common mode choke coil according to yet another embodiment of the present invention.

Subsequently, with reference to FIG. 7, a description is given of a common mode filter according to yet another embodiment of the present invention. FIG. 7 is a sectional view schematically showing a cross section of a common mode choke coil 401 according to yet another embodiment of the present invention. In the common mode choke coil 401 shown in FIG. 5, constituent components that are the same as or similar to those of the common mode choke coil 1 shown in FIGS. 1 to 3 are denoted by reference characters similar to those in FIGS. 1 to 3, and detailed descriptions thereof are omitted.

As shown in FIG. 7, in the common mode choke coil 401, a magnetic core 62' is provided in place of the magnetic core 62. The magnetic core 62' includes a first portion 62a, a second portion 62b, and a third portion 62c. A first magnetic gap 63a is provided between the first portion 62a and a top magnetic layer 4. A second magnetic gap 63b is provided between the first portion 62a and the second portion 62b, and a third magnetic gap 63c is provided between the second portion 62b and the third portion 62c. In one embodiment of the present invention, the first magnetic gap 63a is formed so that a width thereof in a top-bottom direction is larger than each of those of the second magnetic gap 63b and the third magnetic gap 63c in the top-bottom direction. Thus, it is possible to suppress magnetic flux leakage from the second magnetic gap 63b and the third magnetic gap 63c. In one embodiment of the present invention, the first magnetic gap 63a is formed so as to have a cross-sectional area (an area of a cross section cut along a direction perpendicular to a coil axis CA) larger than each of those of the second magnetic gap 63b and the third magnetic gap 63c. With this configuration, a range of magnetic flux leakage from the second magnetic gap 63b and the third magnetic gap 63c can be further decreased.

The magnetic core 62' is obtained by first filling a penetration hole 61 alternately with a resin paste containing a magnetic powder, a binder resin, and a solvent and a sheet member formed of a non-magnetic body or a low magnetic permeability magnetic body and then firing the resin paste and the sheet member thus filled. Specifically, the penetration hole 61 is filled with a resin paste corresponding to the first portion 62a of the magnetic core 62, and a sheet member corresponding to the first magnetic gap 63a is provided on said resin paste. Then, a resin paste corresponding to the second portion 62b is filled on said sheet member, and a sheet member corresponding to the second magnetic gap 63b is provided on said resin paste. Further, a resin paste corresponding to the third portion 62c is filled on said sheet member, and a sheet member corresponding to the third magnetic gap 63c is provided on said resin paste.

The common mode choke coil 401 is formed so that, for example, a ratio (W2'/W1) of a width (W1) in the top-bottom direction between a bottom surface of a first magnetic layer and a top surface of a second magnetic layer to a sum (W2') of a width of the first magnetic gap 63a in the top-bottom direction, a width of the second magnetic gap 63b in the top-bottom direction, and a width of the third magnetic gap 63c in the top-bottom direction is smaller than 0.1.

According to said embodiment, locations where magnetic flux leakage occurs are dispersed, and magnetic flux leakage at each of the locations can be decreased. Thus, it is possible to further suppress an influence of magnetic flux leakage on a frequency characteristic.

The dimensions, materials, and arrangements of the various constituent components described in this specification are not limited to those explicitly described in the embodiments, and the various constituent components can be modified to have arbitrary dimensions, materials, and arrangements within the scope of the present invention. Furthermore, constituent components not explicitly described in this specification can also be added to the embodiments described, and some of the constituent components described in the embodiments can also be omitted.

What is claimed is:

1. A common mode choke coil, comprising:
   a non-magnetic layer;
   a first magnetic layer formed on a top surface of the non-magnetic layer;
   a second magnetic layer formed on a bottom surface of the non-magnetic layer;
   a magnetic core provided between the first magnetic layer and the second magnetic layer so that an axis thereof extends in a top-bottom direction;
   a first coil conductor embedded in the non-magnetic layer and wound around the magnetic core;
   a second coil conductor embedded in the non-magnetic layer and wound around the magnetic core; and
   a first magnetic gap provided between either a top surface of the magnetic core and a bottom surface of the first magnetic layer or a bottom surface of the magnetic core and a top surface of the second magnetic layer,
   wherein the non-magnetic layer is arranged in direct contact with the first magnetic layer and the second magnetic layer.

2. The common mode choke coil according to claim 1, wherein the magnetic core is configured so that the top surface thereof has an area equal to or larger than a cross-sectional area of the magnetic core in a direction perpendicular to the axis.

3. The common mode choke coil according to claim 1,
   wherein the magnetic core has a first portion and a second portion separated from each other in a direction along the axis, and
   wherein the common mode choke coil further comprises a second magnetic gap made of a non-magnetic material, the second magnetic gap being provided between the first portion and the second portion, and
   the second magnetic gap is formed so that a thickness thereof in the top-bottom direction is smaller than a thickness of the first magnetic gap in the top-bottom direction.

4. The common mode choke coil according to claim 1, wherein the first coil conductor is disposed more closely to the first magnetic layer than the second coil conductor, and
   the first magnetic gap has a thickness in the top-bottom direction smaller than a distance between a top surface of the first coil conductor and the first magnetic layer.

5. The common mode choke coil according to claim 1, wherein a ratio of a thickness of the first magnetic gap in the top-bottom direction to a distance between the bottom surface of the first magnetic layer and a top surface of the second magnetic layer is smaller than 0.1.

6. The common mode choke coil according to claim 3, wherein a ratio of a sum of a thickness of the first magnetic gap in the top-bottom direction and a thickness of the second magnetic gap in the top-bottom direction to a distance between the bottom surface of the first magnetic layer and a top surface of the second magnetic layer is smaller than 0.1.

7. The common mode choke coil according to claim 1, wherein the magnetic core comprises a ferrite material.

8. The common mode choke coil according to claim 1, wherein the second magnetic layer has a concave portion formed on a top surface thereof, and wherein a portion of the magnetic core is provided in the concave portion.

9. The common mode choke coil according to claim 8, wherein the concave portion has an arc-shaped cross section.

10. The common mode choke coil according to claim 8, wherein the magnetic core has a protruding portion that protrudes downward from a bottom surface of the non-magnetic layer and into the concave portion.

11. The common mode choke coil according to claim 8, wherein a bottom end surface of the magnetic core has an area that is larger than a cross-sectional area of a portion of the magnetic core other than the bottom end surface.

12. A common mode choke coil, comprising:
a non-magnetic layer;
a first magnetic layer formed on a top surface of the non-magnetic layer;
a second magnetic layer formed on a bottom surface of the non-magnetic layer;
a magnetic core provided between the first magnetic layer and the second magnetic layer so that an axis thereof extends in a top-bottom direction;
a first coil conductor embedded in the non-magnetic layer and wound around the magnetic core;
a second coil conductor embedded in the non-magnetic layer and wound around the magnetic core; and
a first magnetic gap provided between a bottom surface of the magnetic core and a top surface of the second magnetic layer,
wherein the non-magnetic layer has a penetration hole therein and wherein the non-magnetic layer is arranged in direct contact with the first magnetic layer and the second magnetic layer,
wherein the second magnetic layer has a concave portion formed on the top surface thereof, and
wherein the magnetic core is provided in the penetration hole and wherein a portion of the magnetic core is provided in the concave portion.

13. The common mode choke coil according to claim 12, wherein the concave portion has an arc-shaped cross section.

14. The common mode choke coil according to claim 12, wherein the magnetic core has a protruding portion that protrudes downward from a bottom surface of the non-magnetic layer and into the concave portion.

15. The common mode choke coil according to claim 12, wherein a bottom end surface of the magnetic core has an area that is larger than a cross-sectional area of a portion of the magnetic core other than the bottom end surface.

16. The common mode choke coil according to claim 1, wherein the first magnetic gap is an air gap.

* * * * *